United States Patent
Gupta et al.

(10) Patent No.: US 6,341,417 B1
(45) Date of Patent: Jan. 29, 2002

(54) PRE-PATTERNED SUBSTRATE LAYERS FOR BEING PERSONALIZED AS NEEDED

(75) Inventors: Dinesh Gupta, Hopewell Junction; Lester Wynn Herron, New Paltz; John U. Knickerbocker, Hopewell Junction; David C. Long; Jawahar P. Nayak, both of Wappingers Falls; Keith C. O'Neil, Hughsonville; Brenda L. Peterson, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/404,510

(22) Filed: Sep. 23, 1999

(51) Int. Cl.$^7$ .................................................. H05K 3/36
(52) U.S. Cl. ............................. 29/830; 29/825; 29/846; 29/852
(58) Field of Search ........................ 29/852, 833, 825, 29/846

(56) References Cited

U.S. PATENT DOCUMENTS

| 3,142,112 A | * | 7/1964 | Burkig et al. ................. 29/852 |
| 4,234,367 A | | 11/1980 | Herron et al. |
| 4,302,625 A | | 11/1981 | Hetherington et al. |
| 4,799,984 A | | 1/1989 | Rellick |
| 4,911,796 A | | 3/1990 | Reed |
| 5,277,929 A | | 1/1994 | Seki et al. |
| 5,302,219 A | * | 4/1994 | Hargis |
| 5,480,503 A | * | 1/1996 | Casey et al. |
| 5,505,809 A | | 4/1996 | Yamamoto et al. |
| 5,937,515 A | * | 8/1999 | Johnson |

* cited by examiner

Primary Examiner—Carl J. Arbes
(74) Attorney, Agent, or Firm—McGinn & Gibb, PLLC; Ira D. Blecker, Esq.

(57) ABSTRACT

A method and structure for personalizing a multi-layer substrate structure includes supplying a generic layer having electrical features and altering the electrical features to produce a personalized layer of the multi-layer substrate.

15 Claims, 3 Drawing Sheets

US 6,341,417 B1

PRE-PATTERNED SUBSTRATE LAYERS FOR BEING PERSONALIZED AS NEEDED

BACKGROUND OF THE INVENTION

1. Field of the Invention

The present invention generally relates to multilayer ceramic substrates and a method of forming the same.

2. Description of the Related Art

In traditional processing, a substrate contains signal or redistribution layers (which contain connections between different points) and voltage layers which look like mesh planes. Signal or redistribution vias pass through, without connecting to, the mesh plane. To the contrary, voltage vias connect with the mesh planes. Conventionally, each layer is fabricated separately which makes the process expensive and time consuming.

Ceramic packages for supporting semiconductor devices and the like include ceramic substrates with printed conductive stripes connected to the device and to input/output pins or other connections which are joined to boards or the like. While many techniques are known for forming such ceramic substrates, one of the most popular procedures for such fabrication involves the casting of what is termed a ceramic greensheet, personalizing (i.e., punching and screening) the greensheet, stacking it with other personalized greensheets and subsequently processing and firing of the stack of ceramic greensheets. The method of producing such multi-layer ceramic (MLC) substrates for semiconductor packaging and other electronics applications is well known as illustrated in U.S. Pat. Nos. 4,234,367, 4,302,625 and 4,799,984, each of which is incorporated herein by reference.

In the traditional method of building MLC substrates, each personalized greensheet layer has a unique pattern which makes the personalization process expensive and time consuming. Accordingly, a new personalization process which is less expensive and time consuming is desired.

Building multi-layer personalized substrates is expensive and time consuming. For example, one part of the process involves applying the signal patterns to each layer (e.g., each greensheet) before lamination. A personalized via pattern must be drilled or punched for each layer as well. A process is needed that would improve the process time and reduce costs.

SUMMARY OF THE INVENTION

It is, therefore, an object of the present invention to provide a structure and method for personalizing a multi-layer substrate structure that includes supplying a generic layer having electrical features and altering the electrical features to produce a personalized layer of the multi-layer substrate. The altering includes selectively filling vias in the generic layer with conductive material and removing portions of electrical wiring on the generic layer. The process further includes supplying a second generic layer identical to the first generic layer and altering the electrical features of the second generic layer to produce a second personalized layer different than the first personalized layer. The altering changes the generic layer into a plurality of differently personalized layers. The generic layer includes a grid of vias and/or a pattern of wiring useful with a plurality of differently personalized layers.

Another embodiment of the invention is a process for personalizing a multi-layer substrate structure that includes supplying a layer having generic electrical features and altering the generic electrical features to produce a personalized layer of the multi-layer substrate. The altering includes selectively filling vias in the layer with conductive material and removing portions of electrical wiring on the layer. The process further includes supplying a second layer identical to the first layer and altering the generic electrical features of the second layer to produce a second personalized layer different than the first personalized layer. The altering changes the generic layer into a plurality of differently personalized layers. The layer includes a generic grid of vias and/or a generic pattern of wiring useful with a plurality of differently personalized layers.

Yet another embodiment of the invention is a multi-layer substrate structure that includes at least one layer having generic electrical features altered to personalize the layer. The electrical features include vias selectively filled with conductive material and/or a wiring pattern having portions selectively removed. The multi-layer substrate further includes a second layer similar to the first layer and having the generic electrical features altered differently than the first layer to personalize the second layer differently from the first layer. The layer can be changed into a plurality of differently personalized layers, and it includes a generic grid of vias and/or a generic pattern of wiring useful with a plurality of differently personalized layers.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

The present invention includes a process/structure which personalizes generic signal or redistribution layers by severing connections and forming conductive vias to create unique product parts. The invention reduces the cost and time associated with multi-layer ceramic (MLC) structures because generic electrical features (e.g., wiring and via patterns) are used for multiple products with different designs. Therefore, the cost associated with forming unique via grids and screen printing unique wiring or voltage patterns is avoided with the invention. In other words, with the invention, the same generic wiring and via patterns can be used for many different products by simply making different vias in the pattern conductive and by severing different connections in the wiring patterns.

Generally, vias are in certain locations (i.e., grids), and signal layers contain wiring in only one direction (i.e., X or Y), whereas voltage layers generally contain mesh patterns. One example of the invention is the fabrication of voltage or reference layers which use a common grid for many different products. The layers are personalized for the different products by making certain vias conductive and by severing connections on the layers (e.g., removing portions of the wiring patterns). Currently, in product fabrication such as multi-layer ceramic greensheet structures, each layer is personalized (e.g., uniquely screen printed, uniquely punched with a via grid).

In a preferred embodiment, a family of products uses a standard voltage pattern and each member of the family utilizes a subset of the vias, which have been incorporated for various chip sizes or chip footprints, to connect to the standard voltage pattern. Therefore, with the invention, each member of the family takes advantage of the common voltage or reference pattern.

In another embodiment, a common pattern for X, Y or redistribution wiring is made for a given family of products. Each layer is personalized by custom laser deletion of undesired portions of the conductors. This methodology lends itself toward both product specific personalization and to customized patterns and provides a means of repair when used with patterned surface or subsurface layers.

Figure 1A:
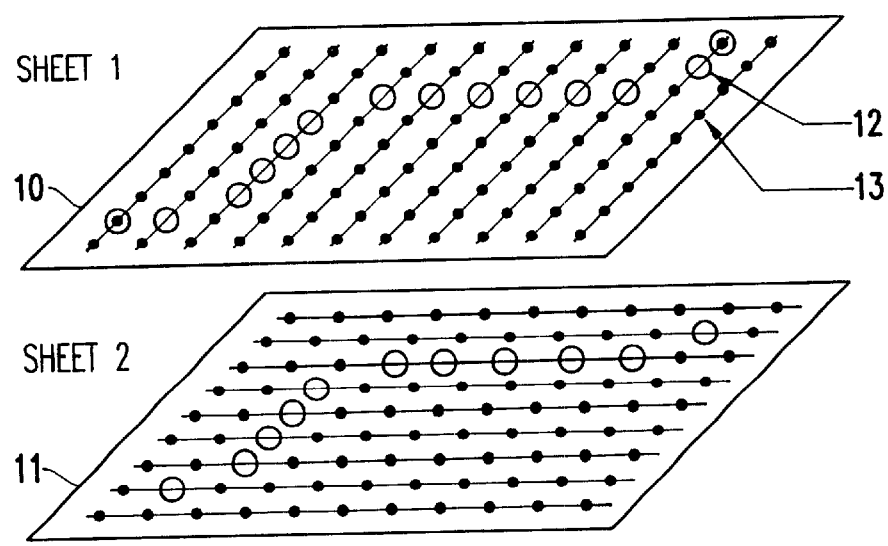
FIG. 1A is a schematic diagram of two layers of a ceramic substrate.

Referring now to FIG. 1A, two layers 10, 11 (sheet 1, X wiring and sheet 2, Y wiring) of a ceramic substrate are shown. The layers are pre-drilled with via holes 13 at regular grid locations. Selected vias 12 (indicated by large circles) are filled with an insulating material such that they do not make electrical contact between the layers (sheets). The remainder of the vias are filled with conductors and the conductive wiring pattern applied.

Figure 1B:
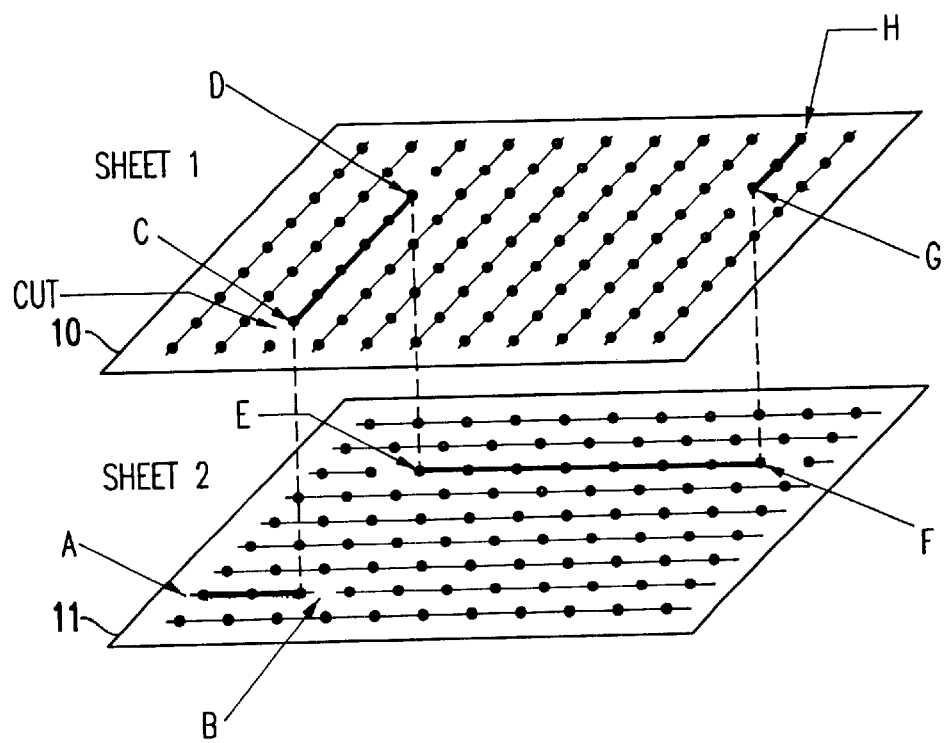
FIG. 1B is a schematic diagram path personalized on a pair of sheets.

In FIG. 1B, a path is personalized on the pair of sheets by filling certain vias with conductors and by removing certain connections. As can be seen in FIG. 1B, the path begins at "A." A wire segment is cut at point "B". A conductive via joins the segments between sheets 1 and 2 at point "C". Segment C–D is similarly isolated by cuts and connected to segment E–F with a conductive via. E–F is similarly connected to G–H to complete the path A–H. The layers are laminated and other layers are similarly personalized and laminated to form the MLC substrate.

Figure 2:
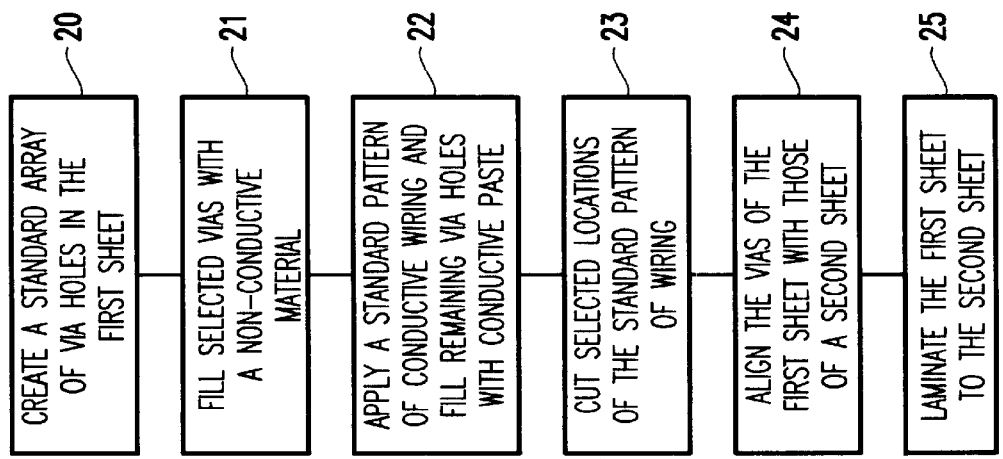
FIG. 2 is a flowchart representation of the process of manufacturing multi-layer substrates.

Referring now to FIG. 2, a flowchart illustrating an embodiment of the invention is shown. In item 20 of the flowchart, a standard (e.g., generic) array of via holes 13 are formed in a sheet 10. Then, in item 21, selected ones of the vias 12 are filled with a non-conductive material. Then, as shown in item 22, a standard (e.g., generic) pattern of conductive wiring is applied and the remaining via holes are filled with a conductive paste. As shown in FIG. 1B, selected locations of the generic wiring pattern are cut (item 23) to personalize the sheet. Then, the vias of sheet 10 are aligned with those of sheet 11, as shown in item 24. Finally, in item 25 sheet 10 is laminated to sheet 11.

Figure 3A:
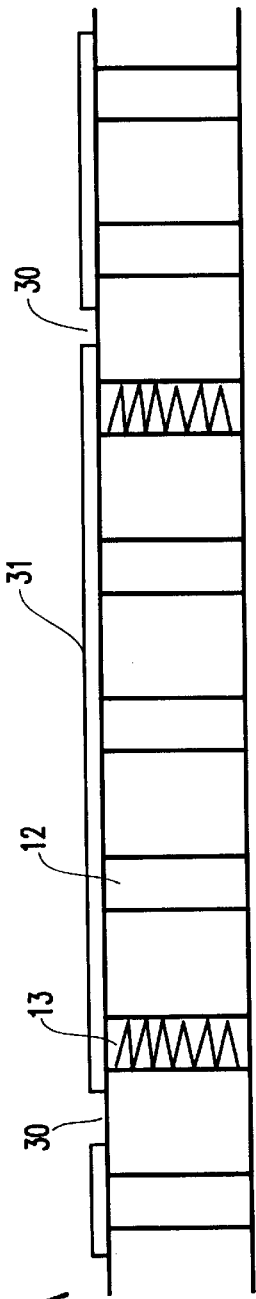
FIGS. 3A–3C are schematic cross-sections of a ceramic sheet.
Figure 3B:
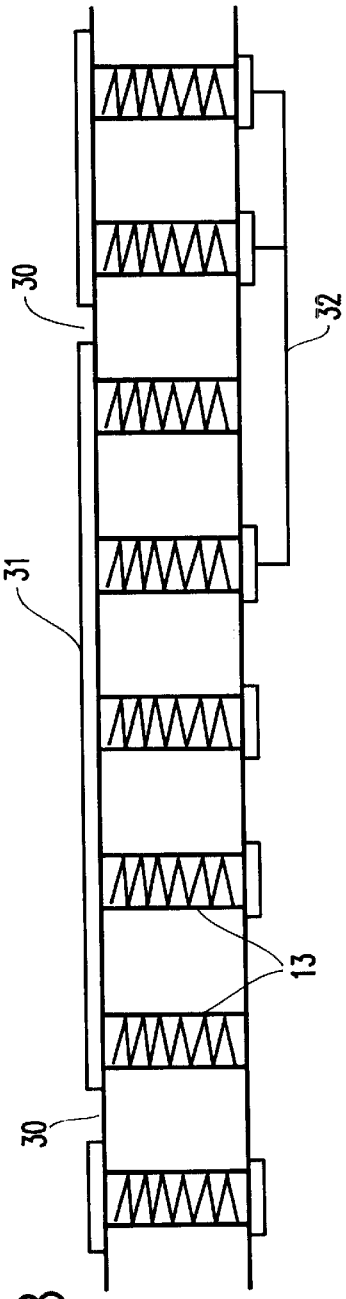

In the process described above, any conventional method can be used to selectively fill the vias with a conductor or insulator, as shown in FIG. 3A, to personalize the otherwise generic sheet. Also illustrated in FIG. 3A are the cuts 30 in the generic wiring pattern 31 which personalize the sheet. For example, a stencil, mask or other similar device can be used to selectively fill the vias with an insulator or conductor using any well known screening process. Similarly, the electrical wiring connections 31 can be cut 30 using any well known process, such as laser cutting, physical cutting, etching, sand blasting, punching, electrically blowing links, grinding, etc. Alternatively, as illustrated in FIG. 3B, all the vias are filled with a conductor 13 and insulating caps 32 are formed over selected ones of the conductors 13 to personalize of the sheet. As would be known by one ordinarily skilled in the art given this disclosure, the caps 32 can be formed in any conventional process, such as screening and other similar processes.

Figure 3C:
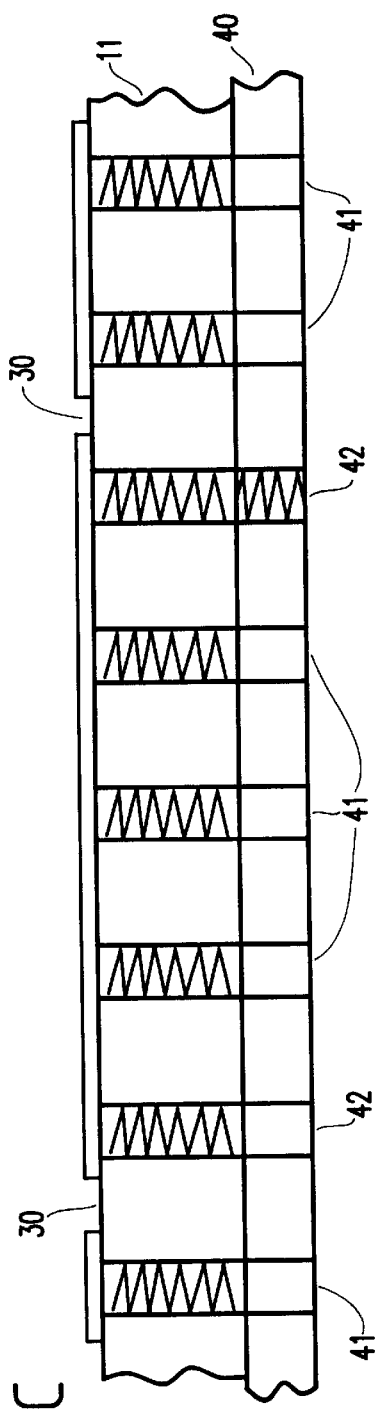

Referring to FIG. 3C, all wiring (X or Y) layers, 11, have all vias filled with conductive paste. In order to connect only selected vias between two layers, an interposer layer 40 is used with the selected vias, 42 (filled with conductive paste) and the other (nonconducting) vias, 41, are left empty. Connections between successive layers are made through selected vias. Sheet 40 may be of different thickness to maintain overall substrate thickness. This method offers several advantages: first a common punch pattern could be used for all layers, second only simple through via masks are required for interposer layers and third, no insulating (nonconductive) paste screening is required.

Figure 4:
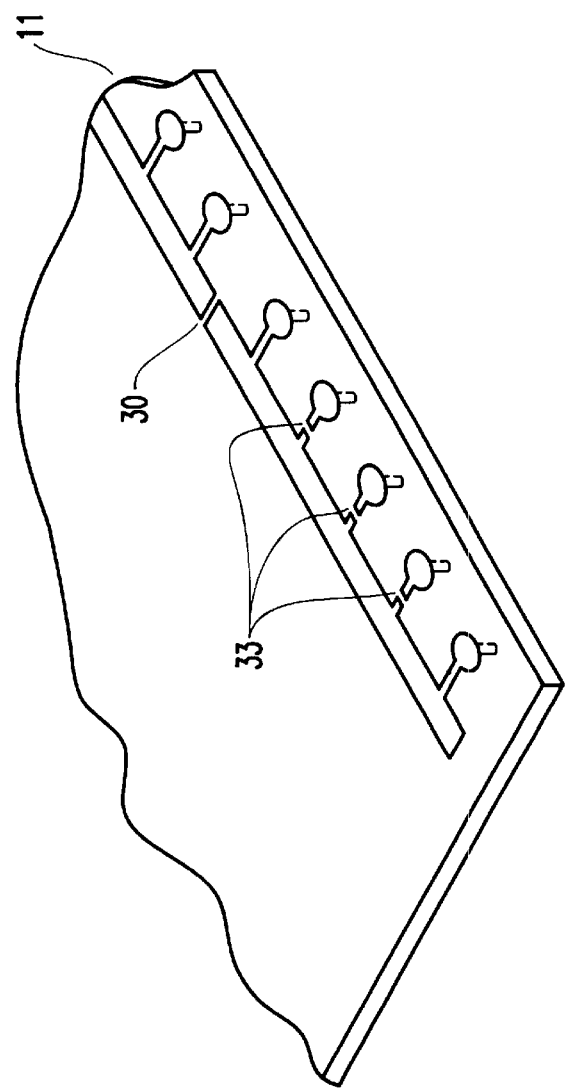
FIG. 4 is a perspective view of a ceramic sheet.

Referring to FIG. 4, lines are screened such that connections to all of the vias are made. Each layer is personalized based on the design requirements. Connections to vias, 33, that are not supposed to be connected are removed using methods such as laser ablation, e-beam, sandblasting, etc. Advantages of this method include use of common punch and screen pattern and elimination of need for screening with insulating paste.

Thus, as described above, the invention uses common generic pre-drilled/pre-wired substrate sheets that are personalized using cuts (e.g., laser) and selective conductive via fills, as needed. While a via interconnect system is described in the preferred embodiment above, as would be known by one ordinarily skilled in the art given this disclosure, other similar processing is possible with the invention. For example, an insulator may be placed against those vias that are not to be conductive thru vias as shown in FIG. 3B.

The invention allows for quicker build times for new products and a reduction of punched sheet part numbers, which results in larger batch size and reduced costs. It is ideal for gang punching of a product. Minimal screening masks would be required.

While the invention has been described in terms of preferred embodiments, those skilled in the art will recognize that the invention can be practiced with modification within the spirit and scope of the appended claims.

What is claimed is:

1. A process for manufacturing a customized multi-layer substrate structure comprising:

supplying a generic layer common to a plurality of products having electrical features; and altering said electrical features to produce a customized layer of said multi-layer substrate, wherein said altering comprises selectively filling vias in said generic layer with one of a conducting material and an insulating material.

2. The process in claim 1, wherein said altering further comprises removing portions of electrical wiring on said generic layer.

3. The process in claim 1, further comprising supplying a second generic layer identical to said generic layer and altering said electrical features of said second generic layer to produce a second customized layer different than said customized layer.

4. The process in claim 1, wherein said altering changes said generic layer into a plurality of differently customized layers.

5. The process in claim 1, wherein said generic layer includes a grid of vias useful with a plurality of differently customized layers.

6. The process in claim 1, wherein said generic layer includes a pattern of wiring useful with a plurality of differently customized layers.

7. A process for manufacturing a customized multi-layer substrate structure comprising:

supplying a generic layer common to a plurality of products having electrical features; and altering said electrical features to produce a customized layer of said multi-layer substrate,
   wherein said altering comprises selectively forming insulating caps adjacent selected ones of conductive vias in said generic layer to render said selected ones of said conductive vias non-conductive.

8. A process for manufacturing a customized multi-layer substrate structure comprising:
   supplying a generic layer common to a plurality of products having electrical features; and
   altering said electrical features to produce a customized layer of said multi-layer substrate,
      wherein said altering comprises selectively forming insulating caps adjacent selected ones of conductive vias in said generic layer to render said selected ones of said conductive vias non-conductive,
      wherein said forming of said insulating caps comprises screening an insulating paste.

9. A process for manufacturing a customized multi-layer substrate structure comprising:
   supplying a generic layer common to a plurality of products having electrical features; and
   altering said electrical features to produce a customized layer of said multi-layer substrate,
      wherein said altering comprises selectively forming insulating caps adjacent selected ones of conductive vias in said generic layer to render said selected ones of said conductive vias non-conductive,
      wherein said forming of said insulating caps comprises placing dry insulating material in said selected ones of said conductive vias.

10. A process for customizing a multi-layer substrate structure comprising:
   supplying a layer having generic electrical features common to a plurality of products; and
   altering said generic electrical features to produce a customized layer of said multi-layer substrate,
      wherein said altering comprises selectively filling vias in said layer with one of a conducting material and an insulating material.

11. The process in claim 10, wherein said altering further comprises removing portions of electrical wiring on said layer.

12. The process in claim 10, further comprising supplying a second layer identical to said layer and altering said generic electrical features of said second layer to produce a second customized layer different than said personalized customized layer.

13. The process in claim 10, wherein said altering changes said layer into a plurality of differently customized layers.

14. The process in claim 10, wherein said layer includes a generic grid of vias useful with a plurality of differently customized layers.

15. The process in claim 10, wherein said layer includes a generic pattern of wiring useful with a plurality of differently customized layers.

* * * * *